United States Patent
Vrudhula et al.

(10) Patent No.: US 10,250,236 B2
(45) Date of Patent: Apr. 2, 2019

(54) ENERGY EFFICIENT, ROBUST DIFFERENTIAL MODE D-FLIP-FLOP

(71) Applicants: Sarma Vrudhula, Chandler, AZ (US); Niranjan Kulkarni, Tempe, AZ (US); Jinghua Yang, Tempe, AZ (US)

(72) Inventors: Sarma Vrudhula, Chandler, AZ (US); Niranjan Kulkarni, Tempe, AZ (US); Jinghua Yang, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 15/575,611

(22) PCT Filed: May 23, 2016

(86) PCT No.: PCT/US2016/033811
§ 371 (c)(1),
(2) Date: Nov. 20, 2017

(87) PCT Pub. No.: WO2016/191385
PCT Pub. Date: Dec. 1, 2016

(65) Prior Publication Data
US 2018/0159512 A1    Jun. 7, 2018

Related U.S. Application Data

(60) Provisional application No. 62/165,327, filed on May 22, 2015.

(51) Int. Cl.
*H03K 3/037* (2006.01)
*H03K 3/012* (2006.01)
*H03K 3/356* (2006.01)

(52) U.S. Cl.
CPC ....... *H03K 3/012* (2013.01); *H03K 3/356139* (2013.01)

(58) Field of Classification Search
None
See application file for complete search history.

(56) References Cited

U.S. PATENT DOCUMENTS 6,366,113 B1    4/2002 Song
7,279,939 B2 *  10/2007 Burleson et al. ............... 327/51
(Continued)

OTHER PUBLICATIONS

Yang, J., et al., "Fast and Robust Differential Flipflops and their Extension to Multi-input Threshold Gates," 2015 IEEE International Symposium on Circuits and Systems (ISCAS), May 24-27, 2015, Lisbon, Portugal, 4 pages.

(Continued)

*Primary Examiner* — Cassandra Cox
(74) *Attorney, Agent, or Firm* — Withrow & Terranova, P.L.L.C.

(57) ABSTRACT

A differential sense flip flop (DSFF) that is named the Kulkarni Vrudhula flip flop (KVFF) is disclosed. In one embodiment, the DSFF includes a differential sense amplifier and an SR latch. The differential sense amplifier includes a first amplifier branch having a first output node, a second amplifier branch having a second, a first switchable discharge path, and a second switchable discharge path. The first switchable discharge path is closed to discharge the first output node when first output node is being discharged by the first amplifier branch and the second switchable discharge path is closed to discharge the second output node when second output node is being discharged by the second amplifier branch. This prevents the output nodes from floating and increases the reliability and robustness of the DSFF.

19 Claims, 1 Drawing Sheet

(56) References Cited

U.S. PATENT DOCUMENTS

| | | | |
|---|---|---|---|
| 8,164,359 B2* | 4/2012 | Leshner et al. | 326/36 |
| 9,876,503 B2* | 1/2018 | Vrudhula et al. | |
| 2002/0036531 A1* | 3/2002 | Hirairi | 327/218 |
| 2002/0171453 A1 | 11/2002 | Kanamori et al. | |
| 2003/0218481 A1* | 11/2003 | Wicht et al. | 327/65 |
| 2009/0195427 A1 | 8/2009 | Naka | |
| 2010/0321061 A1 | 12/2010 | Leshner et al. | |
| 2011/0242927 A1* | 10/2011 | Buer et al. | 365/230.06 |
| 2013/0339914 A1 | 12/2013 | Vrudhula et al. | |
| 2014/0210535 A1* | 7/2014 | Bartling et al. | 327/199 |
| 2014/0247077 A1* | 9/2014 | Singh et al. | 327/199 |
| 2015/0078096 A1* | 3/2015 | Kawasaki | 365/185.23 |
| 2016/0006437 A1* | 1/2016 | Vrudhula et al. | 326/36 |
| 2016/0006438 A1* | 1/2016 | Vrudhula et al. | 326/24 |
| 2017/0187382 A1* | 6/2017 | Vrudhula et al. | |
| 2017/0248989 A1* | 8/2017 | Vrudhula et al. | |

OTHER PUBLICATIONS

International Search Report and Written Opinion for International Patent Application No. PCT/US2016/033811, dated Aug. 19, 2016, 6 pages.

International Preliminary Report on Patentability for International Patent Application No. PCT/US2016/033811, dated Dec. 7, 2017, 5 pages.

* cited by examiner

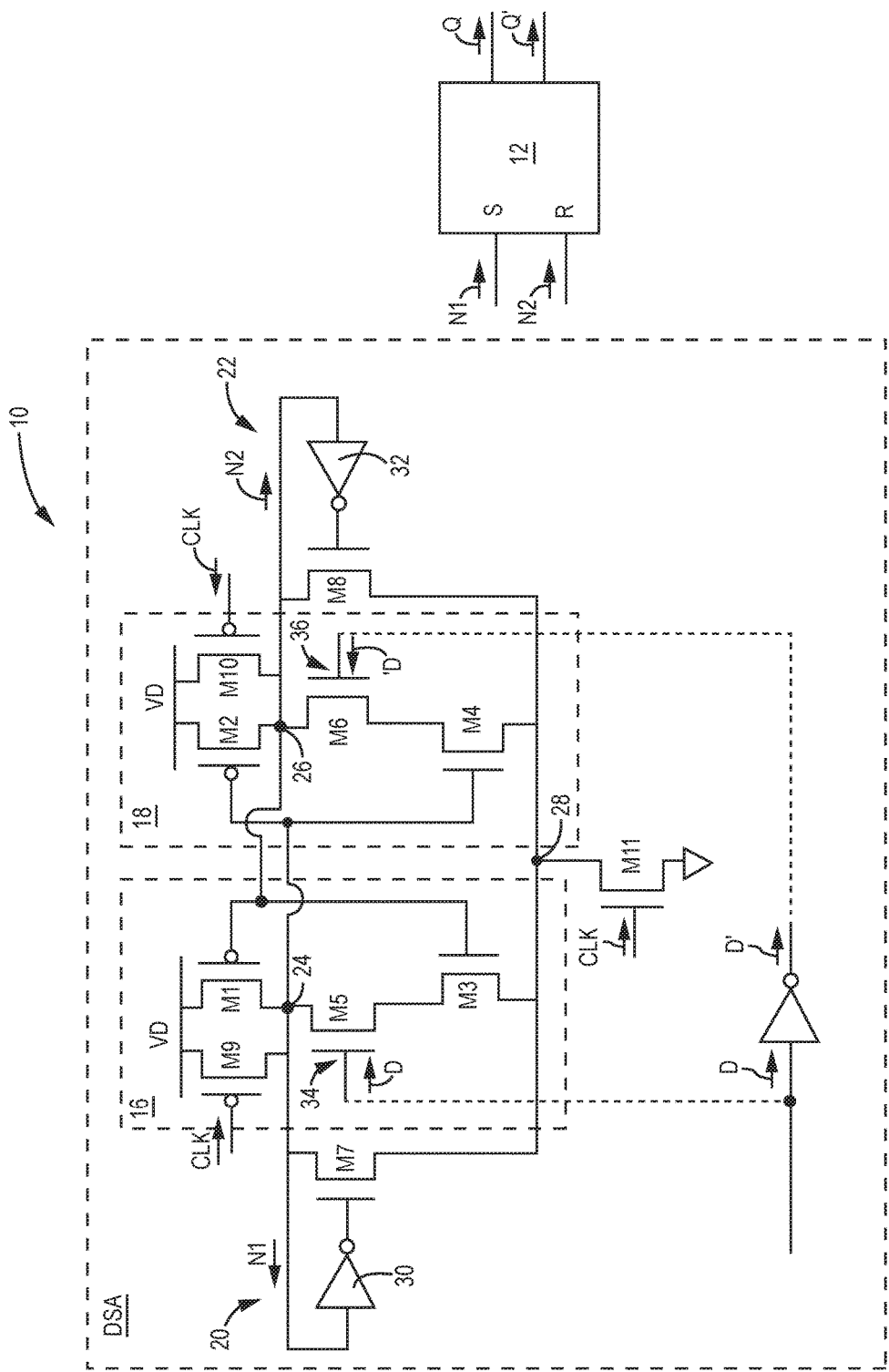

ENERGY EFFICIENT, ROBUST DIFFERENTIAL MODE D-FLIP-FLOP

RELATED APPLICATIONS

This application is a 35 USC 371 national phase filing of PCT/US16/33811, filed May 23, 2016, which claims the benefit of provisional patent application Ser. No. 62/165,327, filed May 22, 2015, the disclosures of which are hereby incorporated herein by reference in their entireties.

GOVERNMENT SUPPORT

This invention was made with government support under 1237856 awarded by the National Science Foundation. The government has certain rights in the invention.

FIELD OF THE DISCLOSURE

This disclosure relates generally to sequential state elements (SSEs) and methods of operating the same.

BACKGROUND

Sequential state elements (SSEs) are used in digital circuits to store logical states from combinational logic circuitry and pass these logical states in a coordinated manner to other circuitry, such as other combinational logic circuits. One type of SSE is a master slave flip flop (MSFF). MSFF have been shown to operate highly reliably in accuracy and relatively robust with respect to noise. Unfortunately, the problem with MSFFs is that MSFFs are relatively slow and energy inefficient.

Accordingly, another type of SSE with greater energy efficiency and speed is the differential sense flip flop (DSFF). However, DSFF tend to suffer from floating nodes. These floating nodes tend to make the DSFF more subject to noise as floating nodes make the DSFF vulnerable to charge injection/ejection. As such most types of DSFF are sensitive to noise and are not very robust.

One type of DSFF is a strong arm flip flop (SAFF) which uses an equalizer transistor tries to deal with floating nodes. However, the SAFF tend to be unreliable. More specifically, the equalizer transistor makes the SAFF vulnerable to process variations where conductance mismatches cause the SAFF to prefer discharging one discharge node over the other leading to evaluation errors.

As such, an arrangement for an SSE is needed that provides greater speed but remains high reliable and robust to noise.

SUMMARY

A sequential state element (SSE) is disclosed, which is a differential sense flip flop (DSFF) that is named the Kulkarni Vrudhula flip flop (KVFF). In one embodiment, the SSE includes a differential sense amplifier and an SR latch. The differential sense amplifier includes a first amplifier branch, a second amplifier branch, a first switchable discharge path, and a second switchable discharge path. The first amplifier branch has a first output node and the second amplifier branch has a second output node. The first amplifier branch and the second amplifier branch are cross coupled such that the first amplifier branch is configured to generate a first logical output of a differential logical output at the first output node and such that the second amplifier branch is configured to generate a second logical output of the differential logical output at the second output node.

The first switchable discharge path is operable to receive the first logical output as feedback from the first amplifier branch and is configured to be opened and closed in accordance with the first logical output. The first switchable discharge path is connected to the first amplifier branch so as to discharge the first output node when the first switchable discharge path is closed. Accordingly, this prevents the second output node from floating since the first switchable discharge path results in the cross coupled second amplifier branch quickly pulling the second output node up since the first output node is quickly discharged through the first switchable discharge path.

The second switchable discharge path is operable to receive the second logical output as feedback from the second amplifier branch and is configured to be opened and closed in accordance with the second logical output. The second switchable discharge path is connected to the second amplifier branch so as to discharge the second output node when the second switchable discharge path is closed. Accordingly, this prevents the first output node from floating since the second switchable discharge path results in the cross coupled first amplifier branch quickly pulling the first output node up since the second output node is quickly discharged through the second switchable discharge path. The SR latch is configured to receive the differential logical output and generate a data output in accordance with the differential logical output.

The switchable discharge paths prevent the output nodes from floating and thereby increase the robustness of the SSE to noise in comparison with to previously known DSFFs. Furthermore, the switchable discharge paths can reduce both the first amplifier branch and the second amplifier branch vulnerability to conductance variations in comparison with strong arm flip flop (SAFF). Finally, the SSE maintains the energy efficiency of a DSFF as well as increases the operating speed in comparison with typical designs of a master slave flip flop (MSFF).

Those skilled in the art will appreciate the scope of the present disclosure and realize additional aspects thereof after reading the following detailed description of the preferred embodiments in association with the accompanying drawing FIGURES.

BRIEF DESCRIPTION OF THE DRAWING FIGURES

The accompanying drawing FIGURES incorporated in and forming a part of this specification illustrate several aspects of the disclosure, and together with the description serve to explain the principles of the disclosure.

FIG. 1 illustrates one embodiment of a differential sense flip flop (DSFF), where the particular arrangement shown in FIG. 1 has been named the Kulkarni Vrudhula flip flop (KVFF).

DETAILED DESCRIPTION

The embodiments set forth below represent the necessary information to enable those skilled in the art to practice the embodiments and illustrate the best mode of practicing the embodiments. Upon reading the following description in light of the accompanying drawing FIGURES, those skilled in the art will understand the concepts of the disclosure and will recognize applications of these concepts not particularly addressed herein. It should be understood that these concepts and applications fall within the scope of the disclosure and the accompanying claims.

FIG. 1 illustrates an exemplary circuit diagram of a differential sense flip flop (DSFF) 10, which is a sequential state element (SSE). The particular arrangement shown in FIG. 1 has been named the Kulkarni Vrudhula flip flop (KVFF). In general, the DSFF 10 includes a differential sense amplifier DSA formed by a first amplifier branch 16, a second amplifier branch 18, a first switchable discharge path 20, and a second switchable discharge path 22. In this embodiment, the DSFF 10 includes a SR latch 12 configured to generate a data output Q and an inverted data output Q' in accordance with the first logical output N1 and the second logical output N2 from the DSFF 10. The inverted data output Q' is an inversion of the data output Q. The first amplifier branch 16 has an output node 24 and the second amplifier branch 18 has an output node 26.

The differential sense amplifier DSA is configured to generate a differential logical output (DLO) from the output node 24 and the output node 26. More specifically, the first amplifier branch 16 and the second amplifier branch 18 are cross coupled such that the first amplifier branch 16 is configured to generate a first logical output N1 of the differential logical output DLO at the output node 24 and such that the second amplifier branch 18 is configured to generate a second logical output N2 of the differential logical output DLO at the output node 26, as explained in further detail below. The first switchable discharge path 20 is operable to receive the first logical output N1 as feedback from the first amplifier branch 16 and is configured to be opened and closed in accordance with the first logical output N1. The first switchable discharge path 20 is connected to the first amplifier branch 16 such that the output node 24 is discharged when the first switchable discharge path 20 is closed. The second switchable discharge path 22 is operable to receive the second logical output N2 as feedback from the second amplifier branch 18 and is configured to be opened and closed in accordance with the second logical output N2. The second switchable discharge path 22 is connected to the second amplifier branch 18 such that the output node 26 is discharged when the second switchable discharge path 22 is closed.

As explained below, the DSFF 10 is operable in an evaluation state and in a reset state. More specifically, the DSFF 10 is synchronized to cycle between the evaluation state and the reset state in accordance with a clock signal CLK. In this embodiment, the differential sense amplifier is operable to receive the clock signal CLK. The differential sense amplifier is configured to operate in the reset state in response to the clock signal CLK being in a first clock state. This embodiment of the DSFF is triggered to operate in the reset state while the clock state is in a low voltage state, which corresponds to a first clock state of logical "0." However, alternate oppositely triggered embodiments of the DSFF 10 may operate in the reset state with the first clock state being a logical "1" instead.

While the clock signal is in the first clock state, the differential sense amplifier is configured to generate the DLO in a precharge state. More specifically, the first amplifier branch 16 is configured to pull up the output node 24 to a high voltage state, which is a logical state of "1." Furthermore, the second amplifier branch 18 is configured to pull up the output node 26 to the high voltage state, which is the logical state of "1." In this case, the first logical output N1 and the second logical output N2 are in the same logical state. Accordingly, the SR latch 12 is configured to hold the data output Q and the inverted data output Q' in response to the first logical output N1 and the second logical output N2 both having the same logical state.

The differential sense amplifier is configured to operate in the evaluation state in response to the clock signal CLK being in a second clock state. Again in this embodiment, the differential sense amplifier is configured to operate in the evaluation state with the clock signal CLK being in a low voltage state corresponding to the second clock state being "1." Other alternate oppositely triggered embodiments of the DSFF 10 may operate in the reset state with the second clock state being a logical "0" instead.

The differential sense amplifier is configured to generate the DLO in any one of a set of differential output states during the evaluation state. More specifically, the first amplifier branch 16 of the differential sense amplifier is configured to receive a data input D and the second amplifier branch 18 is configured to receive an inverted data input D'. The data input D and the inverted data input D' are inverted with respect to one another. Thus, the data input D and the inverted data input D' are a differential data input. During the reset state, the DSFF 10 is opaque and the data input D and the inverted data input D' don't affect the data output Q and the inverted data output Q'. However, in response to the clock signal CLK being in the second clock state, the DSFF 10 is transparent and operates in the evaluation state. Thus, while the clock signal CLK is in the second clock state, the DSFF 10 is configured to set the data output Q and the inverted data output Q' in accordance with the data input D and the inverted data input D'.

More specifically, the first amplifier branch 16 and the second amplifier branch 18 will be in a current race. The differential input is configured to be provided in any one of a set of differential input states. More specifically, the differential input is in a first differential input state of "1/0" when the data input D has a logical state of "1" and the inverted data input D' has a logical state 0." The differential input is in a second differential input state of "0/1" when the data input D has a logical state of "0" and the inverted data input D' has a logical state 1." The differential sense amplifier 14 is configured so that whichever one of the first amplifier branch 16 and the second amplifier branch 18 receives the logical state "1" should win the current race, as explained in further detail below. More specifically, the first amplifier branch 16 is configured to discharge the output node 24 in response to the data input D being a logical "1" while the clock signal is in the second clock state. On the other hand, the second amplifier branch 18 is configured to discharge the output node 26 in response to the inverted data input D' being a logical "1" while the clock signal is in the second clock state.

The first amplifier branch 16 is cross coupled to the output node 26 of the second amplifier branch 18 and the second amplifier branch 18 is cross coupled to the output node 24 of the first amplifier branch 16. As such, the second amplifier branch 18 is configured to receive the first logical output N1 from the output node 24 as feedback. Therefore, if the differential input was in the first differential input state "0/1", the first amplifier branch 16 is configured to discharge the output node 24 and the first logical output N1 will be a logical "0" once the output node 24 discharges. In response to the first logical output N1 having the logical state "0", the second amplifier branch 18 is configured to pull up the output node 26 and maintain the second logical output N2 at the logical state of "1." In this case, therefore, the differential sense amplifier is configured to generate the DLO in a first differential output state of "0/1."

Note however, that this operation is dependent on the output node 24 discharging fast enough so that the second amplifier branch 18 is forced by the first logical output N1 to pull up the output node 26 before it discharges sufficiently due to leakage currents. Until this happens, the output node 26 is simply holding charge and is left floating. The output node 26 would thus be vulnerable to noise on the data input D and the inverted data input D' as well as the effects of device variations. To prevent the output node 26 and other nodes in the second amplifier branch from floating, the first amplifier branch 16 is configured to closed in response to the first logical output N1 having the logical state "0." As such, the first switchable discharge path 20 provides the output node 24 with a closed path to ground and therefore prevents nodes in the second amplifier branch 18 from floating. The SR latch 12 in this embodiment is a NAND SR latch. Therefore in response to the DLO being in the first differential output state of "0/1," the SR latch 12 is configured to generate the data output Q having a logical state of "1" and the inverted data output Q' having a logical state "0." Note therefore that during the evaluation state, the logical state of data output Q is the same as the logical state of the data input D and the logical state of inverted data output Q' is the same as the logical state of the inverted data input D'.

The first amplifier branch 16 is configured to receive the second logical output N2 from the output node 26 as feedback. Therefore, if the differential input was in the second differential input state "0/1", the second amplifier branch 18 is configured to discharge the output node 26 and the second logical output N2 will be a logical "0" once the output node 26 discharges. In response to the second logical output N2 having the logical state "0", the first amplifier branch 16 is configured to pull up the output node 24 and maintain the first logical output N1 at the logical state of "1." In this case, therefore, the differential sense amplifier is configured to generate the DLO in a second differential output state of "1/0."

Note however, that this operation is dependent on the output node 26 discharging fast enough so that the first amplifier branch 16 is forced by the second logical output N2 to pull up the output node 24 before it discharges sufficiently due to leakage currents. Until this happens, the output node 24 is simply holding charge and is left floating. The output node 24 would thus be vulnerable to noise on the data input D and the inverted data input D' as well as the effects of device variations. To prevent the output node 24 and other nodes in the first amplifier branch from floating, the second amplifier branch 18 is configured to closed in response to the second logical output N2 having the logical state "0." As such, the second switchable discharge path 22 provides the output node 26 with a path to ground and therefore prevents nodes in the first amplifier branch 16 from floating. The SR latch 12 in this embodiment is a NAND SR latch. Therefore in response to the DLO being in the second differential output state of "1/0," the SR latch 12 is configured to generate the data output Q having a logical state of "0" and the inverted data output Q' having a logical state "1." Note therefore that during the evaluation state, the logical state of data output Q is the same as the logical state of the data input D and the logical state of inverted data output Q' is the same as the logical state of the inverted data input D'.

Accordingly, these switchable discharge paths 20, 22 quickly pull down their respective output node 24, 26 of their respective amplifier branch 16, 18 thereby preventing the output nodes 26, 24 in the other amplifier branch 18, 16 from floating. As such, the switchable discharge paths 20, 22 also help increase operating speeds.

The differential sense amplifier DSA is configured to generate the differential logical output DLO in accordance with the data input D and the inverted data input D'. In this embodiment, the differential sense amplifier DSA includes the transistors M1-M11. Each of the transistors M1-M11 is a field effect transistor (FET), such as a Complementary Metal-Oxide-Semiconductor (CMOS) transistor. However, the present invention is not limited thereto and other types of transistors, such as other types of FETs, may be utilized.

The first amplifier branch 16 is formed by transistors M1, M3, M5, M9. The transistors M1, M3 are a pair of push-pull transistors. The first switchable discharge path 20 includes an inverter gate 30 and a transistor M7. The first switchable discharge path 20 is connected to the first amplifier branch 16 so as to discharge the output node 24 when the first switchable discharge path 20 is closed. Likewise, the second amplifier branch 18 is formed by transistors M2, M4, M6, M10. The transistors M2, M4 are a pair of push-pull transistors. The second switchable discharge path 22 includes an inverter gate 32 and a transistor M8. The second switchable discharge path 22 is connected to the second amplifier branch 18 so as to discharge the output node 26 when the first switchable discharge path 20 is closed. The SR latch 12 has a first input terminal S connected to an output node 24 of the first amplifier branch 16 and a second input terminal R connected to an output node 26 of the second amplifier branch 18. As explained above, based on the differential logical output DLO at the output nodes 24 and 26, the SR latch 12 operates to provide the data output Q and an inverted data output Q', which is inverted with respect to the data output Q.

To time the operation of the DSFF 10, the DSA includes the transistors M9, M10, M11. Each transistor M9, M10 is a PFET. The transistor M11 is an NFET. A drain of the transistor M9 is connected to the output node 24, a gate of the transistor M9 is connected to receive the clock signal CLK, a source of the transistor M9 is connected to receive the supply voltage VD. A drain of the transistor M10 is connected to the output node 26, a gate of the transistor M10 is connected to receive the clock signal CLK, and a source of the transistor M10 is connected to receive the supply voltage VD. A source of the transistor M11 is connected to ground, a gate of the transistor M11 is connected to receive the clock signal CLK, and a drain of the transistor M11 is connected to receive the isolated control node 28.

With respect to the first amplifier branch 16, each of the transistors M1, M7 is a P-channel field effect transistor (PFET). Each of the transistors M1, M9 also has a source coupled to receive a supply voltage VD and a drain coupled to the output node 24. A gate of the transistor M1 is coupled to the output node 26 of the second amplifier branch 18 and is thus configured to receive the second logical output N2 from the second amplifier branch 18 as feedback. A gate of the transistor M9 is coupled to receive the clock signal CLK. Thus, the transistors M1, M9 are each configured to drive the output node 24 near a DC voltage level of the supply voltage VD when activated. As such, the transistors M1, M9 drive the logical output N1 at the output node 24 to a logical "1" when activated, as explained in further detail below. Each of the transistors M3, M5 is an N-channel field effect transistor (NFET). A drain of the transistor M5 is coupled to the output node 24, and a source of the transistor M5 is coupled to a drain of the transistor M3. A source of the transistor M3 is coupled to an isolated control node 28. The isolated control node 28 is connected to the transistor M11. More specifically, the transistor M11 is an NFET. A drain of the transistor M11 is connected to the isolated control node 28 and the source of the transistor M11 is connected to ground. The transistor M3 and the transistor M5 therefore form a third switchable discharge path 34 connected so as to discharge the output node 24 when closed. When either or both of the transistor M3 or the transistor M5 are deactivated, the third switchable discharge path 34 is open.

However, when both the transistors M3, M5 are activated the third switchable discharge path 34 is closed. Note that the gate of the transistor M5 is configured to receive the data input D and a gate of the transistor M3 is configured to receive the second logical output N2 from the second amplifier branch 18 as feedback. A gate of the transistor M11 is configured to receive the clock signal CLK. When all the logical states of the data input D, the second logical input N2 and the clock signal CLK are at logical state of "1", the third switchable discharge path 34 is closed and the output node 24 is discharged and pulled near ground.

Note that in this embodiment, the transistor M5 (which receives the data input D) is stacked between the pair of push-pull transistors M1, M3. Furthermore, the closing of the first switchable discharge path 20 quickly discharges the output node 24. This prevents the output node 26 from floating and thereby quickly prevents the transistor M3 from floating. As such by providing the transistor M5 between the push-pull transistors M1, M3, the output node 24 is prevented from being charged by leakage currents even if the data input D received by the transistor M5 changes after a leading edge of the clock signal CLK. This not only increases the speed of the first amplifier branch 16 but also makes the first amplifier branch 16 less subject to noise.

The transistor M5 of the third switchable discharge path 34 has a drain connected to the output node 24 and a source connected to the isolated control node 28. Thus the third switchable discharge path 34 is connected between the output node 24 and the isolated control node 28. The inverter gate 30 has an input terminal connected to receive the first logical output N1 as feedback from the output node 24. A gate of the transistor M7 is connected to an output terminal of the inverter gate 30. Accordingly, the transistors M3, M5, M7 drive the first logical output N1 to the logical state "0" when activated.

Note that the gate of the transistor M1 and the gate of the transistor M3 are coupled to the output node 26 of the second amplifier branch 18 and are thus also configured to receive the logical output N2 from the second amplifier branch 18. The gate of the transistor M5 is coupled to receive the data input D. In this manner, the first amplifier branch 16 forms a first NAND gate, where the isolated control node 28 can be considered an input node and the gate of the transistor M1 can be considered as another input node. The output node 24 provides the output node of the first NAND gate.

With respect to the second amplifier branch 18, each of the transistors M2, M8 is a P-channel field effect transistor (PFET). Each of the transistors M2, M10 also has a source coupled to receive a supply voltage VD and a drain coupled to the output node 26. A gate of the transistor M2 is coupled to the output node 24 of the first amplifier branch 16 and is thus configured to receive the first logical output N1 from the first amplifier branch 16 as feedback. A gate of the transistor M10 is coupled to receive the clock signal CLK. Thus, the transistors M2, M10 are each configured to drive the output node 26 near a DC voltage level of the supply voltage VD when activated. As such, the transistors M2, M10 drive the logical output N2 at the output node 26 to a logical "1" when activated, as explained in further detail below. Each of the transistors M4, M6 is an N-channel field effect transistor (NFET). A drain of the transistor M6 is coupled to the output node 26, and a source of the transistor M6 is coupled to a drain of the transistor M4. The transistor M4 and the transistor M6 therefore form a fourth switchable discharge path 36 connected so as to discharge the output node 26 when closed. When either or both of the transistor M4 or the transistor M6 are deactivated, the fourth switchable discharge path 36 is open.

However, when both the transistors M4, M6 are activated the fourth switchable discharge path 36 is closed. Note that the gate of the transistor M6 is configured to receive the inverted data input D' and a gate of the transistor M4 is configured to receive the first logical output N1 from the first amplifier branch 16 as feedback. The gate of the transistor M11 is configured to receive the clock signal CLK. When all the logical states of the inverted data input D', the first logical input N1 and the clock signal CLK are at logical state of "1", the fourth switchable discharge path 36 is closed and the output node 26 is discharged and pulled near ground.

Note that in this embodiment, the transistor M6 (which receives the inverted data input D') is stacked between the pair of push-pull transistors M2, M4. Furthermore, the closing of the second switchable discharge path 22 quickly discharges the output node 26. This prevents the output node 24 from floating and thereby quickly prevents the transistor M4 from floating. As such by providing the transistor M6 between the push-pull transistors M2, M4, the output node 26 is prevented from being charged by leakage currents even if the inverted data input D' received by the transistor M6 changes after a leading edge of the clock signal CLK. This not only increases the speed of the second amplifier branch 18 but also makes the second amplifier branch 18 less subject to noise.

The transistor M6 of the fourth switchable discharge path 36 has a drain connected to the output node 26 and a source connected to the isolated control node 28. Thus the fourth switchable discharge path 36 is connected between the output node 26 and the isolated control node 28. The inverter gate 32 has an input terminal connected to receive the second logical output N2 as feedback from the output node 26. A gate of the transistor M8 is connected to an output terminal of the inverter gate 30. Accordingly, the transistors M4, M6, M8 drive the second logical output N2 to the logical state "0" when activated.

Note that the gate of the transistor M2 and the gate of the transistor M4 are coupled to the output node 24 of the first amplifier branch 16 and are thus also configured to receive the logical output N1 from the first amplifier branch 16. The gate of the transistor M6 is coupled to receive the inverted data input D'. In this manner, the second amplifier branch 18 forms a second NAND gate, where the isolated control node 28 can be considered an input node and the gate of the transistor M2 can be considered as another input node. The output node 26 provides the output node of the second NAND gate.

The DSFF 10 of FIG. 1 operable in a reset state and an evaluation state. The DSFF 10 cycles through the reset state and the evaluation state in accordance the clock signal CLK. More specifically, in order to enter the reset state, the clock signal CLK is set to a high voltage state corresponding to a logical state of "0." As a result, the transistor M9 and the transistor M10 are both activated, and the transistor M11 is deactivated. Therefore, the isolated control node 28 cannot be discharged through transistor M11.

The transistors M1 and M3 are activated, and the transistors M3, M4, M7, M8, M11 are deactivated. The third switchable discharge path 34 (formed by the transistors M3, M5 in the first amplifier branch 16) and the fourth switchable discharge path 36 (formed by the transistors M4, M6 in the second amplifier branch 18) are thus both open. Furthermore, the first switchable discharge path 20 formed by the inverter gate 30, transistor M7 in the first amplifier branch 16 and the second switchable discharge path 22 formed by the transistors M4, M6 in the second amplifier branch 18 are thus both open. Therefore, the output node 24 and the output node 26 are prevented from are prevented from being discharged during the reset state. Furthermore, the transistors M9 is configured to pull the output node 24 of the first amplifier branch 16 near the DC supply voltage level of the supply voltage VD in response the clock signal being "0." Accordingly, the first logical output N1 is provided at a logical state of "1" since the output node 24 is charged to a high voltage state (i.e., near a DC voltage magnitude of the supply voltage VD) during the reset state. Likewise, and the transistor M10 is configured to pull the output node 26 of the second amplifier branch 18 near the DC supply voltage level of the supply voltage VD in response to the clock signal being at a logical state of "0." Thus, the second logical output N2 is also provided at logical state of "1" since the output node 26 is charged to a high voltage state (i.e., near a DC voltage magnitude of the supply voltage VD) during the reset state. The differential logical output DLO is thus set to a precharge state of "1/1" during the reset state. The SR latch 12 therefore is configured to hold the data output Q and the inverted output Q'. Once the reset state is complete, the transistors M3, M4, M9, and M10, M11 are deactivated, and the remaining transistors M1 and M2 are activated. At this point, the DSFF 10 is primed for evaluation.

On the rising edge of the clock signal CLK, the DSFF 10 transitions to the evaluation state. The DSFF 10 is maintained in the evaluation state while the non-inverted clock signal CLK is in a clock state of "1." The differential sense amplifier DSA is configured to set one of the logical outputs N1, N2 to a logical state of "0" and maintain the other one of the logical outputs N2, N1 at a logical state of "1" during the evaluation state. More specifically, the differential sense amplifier DSA is configured to discharge one of the output nodes 24, 26 to a low voltage state (i.e. logical state of "0") and prevent the discharge of the other one of the output nodes 26, 24 so as to maintain the other one of the output nodes in the high voltage state (logical state of "1") during the evaluation state. The differential logic output DLO is thus provided in either a first differential output state (e.g., "1/0") or in a second differential output state (e.g., "0/1") opposite the second differential output state during the evaluation state. This may result in a transition in data output Q and data output Q' of the SR latch 12.

More specifically, as the clock signal CLK rises; a current race begins between the first amplifier branch 16 and the second amplifier branch 18. During the evaluation state, the transistor M9 and the transistor M10 are both deactivated, and the transistor M11 are both activated by the clock signal being in the logical state "0."

The first amplifier branch 16 wins the current race when the transistor M5 is activated by the data input D being at logical "1," which results in the third switchable discharge path 34 beginning to close and the first logical output N1 to decrease in voltage. As such, the first switchable discharge path 20 is closed and the output node 24 discharges to ground. Furthermore, the gates of the push-pull transistors M2, M4 also have a path to ground. As such, the transistor M4 maintains the second switchable discharge path 22 open and the transistor M2 pulls the output node 26 near the supply voltage VD. The transistor M6 is also deactivated by the inverted data input D' being a logical "0," which also prevents the fourth switchable discharge path 36 from closing. As such, the fourth switchable discharge path 36 remains open. In this case, a conductance at the output node 24 is greater than a conductance at the output node 26.

Likewise, the second amplifier branch 18 wins the current race when the transistor M6 is activated by the inverted data input D' being at logical "1," which results in the second switchable discharge path 22 beginning to close and the second logical output N2 to decrease in voltage. As such, the second switchable discharge path 22 is closed and the output node 26 discharges to ground. Furthermore, the gates of the push-pull transistors M1, M3 also have a path to ground. As such, the transistor M3 maintains the second switchable discharge path 22 open and the transistor M1 pulls the output node 24 near the supply voltage VD. The transistor M5 is also deactivated by the data input D being a logical "0," which also prevents the third switchable discharge path 34 from closing. As such, the third switchable discharge path 34 remains open. In this case, a conductance at the output node 26 is greater than a conductance at the output node 24.

Note that the gate of the transistor M3 is coupled to the output node 24 so as to receive the logical output N2 as feedback from the first amplifier branch 16. Additionally, the gate of the transistor M4 is coupled to the output node 24 so as to receive the logical output N1 as feedback from the first amplifier branch 16. Since both the logical outputs N1, N2 where set to logical state of "1" during the reset state, the gates of both the transistors M3, M4 initially receive a logical state of "1" at the beginning of the evaluation state. Note that the gate of the transistor M2 and the gate of the transistor M4 are coupled to the output node 26 so as to receive the logical output N2 as feedback from the second amplifier branch 18. Since both the logical outputs N1, N2 where set to logical state of "1" during the reset state, the gates of both pairs of push-pull transistors M1, M3, and M2, M4 initially receive a logical state of "1" at the beginning of the evaluation state.

Accordingly, the output node 24, 26 that is provided at logical state of "0" fastest will result in either the transistor M7 or the transistor M8 being activated and either the transistors M3, M5 or the transistors M4, M6 being activated. If the transistors M3, M5 are activated, the third switchable discharge path 34 formed by the transistors M3, M5 and the first switchable discharge path 20 are both closed and the output node 24 is discharged. Accordingly, the logical output N1 is provided at logical state of "0." In response, the transistor M2 is activated to maintain the output node 26 and the logical output N2 at logical state of "1." If the transistors M4, M6 are activated, the fourth switchable discharge path 36 formed by the transistors M4, M6 and the second switchable discharge path 22 are both closed and the output node 26 is discharged. Accordingly, the logical output N2 is provided at logical state of "0." In response, the transistor M1 is activated to maintain the output node 24 and the logical output N1 at logical state of "1."

More specifically, the first amplifier branch 16 wins the current race if the transistor M5 is activated by the data output D being in the logical state "1." In this case, due to a conductance of the first amplifier branch 16 being higher than a conductance of the second amplifier branch 18, the output node 24 discharges faster than the output node 26. The first logical output N1 is thus set to a logical "0" during the evaluation state of the DSFF 10. Since the first switchable discharge path 20 and the third switchable discharge path 34 are both closed, the output node 24 causes the first logical output N1 to activate the transistor M2. Thus, even if the output node 26 starts to discharge, the discharge of the output node 26 is impeded by the transistor M2 (which is activated) thereby resulting in the output node 26 getting quickly pulled back to the high voltage state. Thus, the second logical output N2 is maintained at logical "1." Accordingly, the differential logical output DLO is provided to have a differential output state of "0/1," during the evaluation state when the data input D is at logical "1" and the inverted data input D' is at logical "0."

The second amplifier branch 18 wins the current race if the transistor M6 is activated by the inverted data output D' being in the logical state "1." In this case, due to a conductance of the second amplifier branch 18 being higher than a conductance of the first amplifier branch 16, the output node 26 discharges faster than the output node 24. The second logical output N2 is thus set to a logical "0" during the evaluation state of the DSFF 10. Since the second switchable discharge path 22 and the fourth switchable discharge path 36 are both closed, the output node 26 causes the second logical output N2 to activate the transistor M1. Thus, even if the output node 24 starts to discharge, the discharge of the output node 24 is impeded by the transistor M1 (which is activated) thereby resulting in the output node 24 getting quickly pulled back to the high voltage state. Thus, the first logical output N1 is maintained at logical "1." Accordingly, the differential logical output DLO is provided to have a differential output state of "1/0," during the evaluation state when the inverted data input D' is at logical "1" and the data input D is at logical "0."

The switchable discharge paths 20, 22 thereby provide a paths to ground even if the data input D and the inverted data input D' are highly noisy and change logical states. Furthermore, the switchable discharge paths 20, 22 also prevent the output node 24, 26 that is being discharged by their respective amplifier branch 16, 18 from being charged by leakage currents. The switchable discharge paths 20, 22 thereby make the DSFF 10 more robust. The gates of the transistors M7, M8 are driven by the output terminals of the inverter gates 30, 32 while the drains of the transistors M7, M8 are connected to the output node 24, 26 respectively. As such, the transistors M7, M9 each operate in a diode mode when activated and thus do not significantly load the third switchable discharge path 34 and the fourth switchable discharge path 36. Glitches in the amplifier branch 16, 18 being discharged are also reduced or eliminated as the output node 24, 26 that remains charged is prevented from floating. The inverter gates 30, 32 reduce amount of loading the transistors M3, M4 introduce to the output nodes 24, 26 by transistors M3, M4, which helps speed up operating speeds.

The logical outputs Q and Q' of the SR latch 12 are adjusted accordingly by the SR latch 12. The differential logical output DLO includes a first logical output N1 that is received by the input terminal S of the SR latch 12. In this embodiment, the SR latch 12 is an SR latch. The input terminal S is the set terminal of the SR latch 12, and the first logical signal N1 is received at the input terminal S. The differential logical output DLO includes a second logical output N2 that is received by the input terminal R of the SR latch 12. The input terminal N2 is the reset terminal of the SR latch 12, and the second logical output N2 is received at the input terminal R. Note that when the differential logical output DLO is set to the precharge state after the reset state, the SR latch 12 is configured to hold the data output Q and the inverted data output Q'. However, after the evaluation state, the SR latch 12 is configured to set the data output Q to logical state of "1" and the inverted data output Q' to logical state of "0" in response to the differential logical output DLO being provided at the differential output state of "0/1" and to set the data output Q to logical state of "0" and the inverted data output Q' to logical state of "1" in response to the differential logical output DLO being provided at the differential output state of "1/0."

Furthermore, note that after evaluation completes, all nodes in the DSFF 10 have a closed path to either the supply voltage VD or ground. Because of this, the output nodes 24, 26 are latched, and no change in the data input D and the inverted data input D' in either of the first amplifier branch 16 and the second amplifier branch 18 will have any effect on the logical states stored at the output nodes 24, 26 until the beginning of the next evaluation.

Those skilled in the art will recognize improvements and modifications to the preferred embodiments of the present disclosure. All such improvements and modifications are considered within the scope of the concepts disclosed herein and the claims that follow.

What is claimed is:

1. A sequential state element (SSE) comprising:
    a differential sense amplifier comprising a first amplifier branch having a first output node, a second amplifier branch having a second output node, a first switchable discharge path, and a second switchable discharge path wherein:
        the differential sense amplifier is configured to receive a clock signal that oscillates between a first clock state and a second clock state and wherein while the clock signal is in the first clock state, the first amplifier branch is configured to charge the first output node and the second amplifier branch is configured to charge the second output node such that a differential logical output is in a precharge state;
        the first amplifier branch and the second amplifier branch are cross coupled such that the first amplifier branch is configured to generate a first logical output of the differential logical output at the first output node and such that the second amplifier branch is configured to generate a second logical output of the differential logical output at the second output node;
        the first switchable discharge path is operable to receive the first logical output as feedback from the first amplifier branch; the first switchable discharge path is configured to be opened and closed in accordance with the first logical output wherein the first switchable discharge path is connected to the first amplifier branch so as to discharge the first output node when the first switchable discharge path is closed; and
        the second switchable discharge path is operable to receive the second logical output as feedback from the second amplifier branch, the second switchable discharge path is configured to be opened and closed in accordance with the second logical output wherein the second switchable discharge path is connected to the second amplifier branch so as to discharge the second output node when the second switchable discharge path is closed; and
    a latch configured to receive the differential logical output and generate a data output in accordance with the differential logical output.

2. The SSE of claim 1 wherein the latch is an SR latch.

3. The SSE of claim 2 wherein the SR latch is a NAND SR latch.

4. The SSE of claim 1 wherein the first amplifier branch is cross connected to the second output node of the second amplifier branch and the second amplifier branch is cross connected to the first output node of the first amplifier branch.

5. The SSE of claim 1 wherein the latch is configured to hold the data output in response to the differential logical output being in the precharge state.

6. The SSE of claim 1 wherein the first amplifier branch is configured to receive a data input and the second amplifier branch is configured to receive an inverted data input that is inverted with respect to the data input, wherein while the clock signal is in the second clock state:
the first amplifier branch is configured to discharge the first output node in response to the data input being in a first logical state;
the first switchable discharge path is configured to close in response to the first amplifier branch discharging the first output node;
the second amplifier branch being configured to maintain the second output node charged in response to the inverted data input being in a second logical state; and
the second switchable discharge path is configured to remain open while the second output node is maintained charged.

7. The SSE of claim 6 wherein while the clock signal is in the second clock state:
the second amplifier branch is configured to discharge the second output node in response to the inverted data input being in the first logical state;
the second switchable discharge path is configured to close in response to the second amplifier branch discharging the second output node;
the first amplifier branch being configured to maintain the first output node charged in response to the data input being in the second logical state; and
the first switchable discharge path is configured to remain open while the first output node is maintained charged.

8. The SSE of claim 7 wherein while the clock signal is in the second clock state:
the first logical output is generated in the second logical state when the first amplifier branch discharges the first output node;
the second logical output is generated in the second logical state when the second amplifier branch discharges the second output node;
the first logical output is generated in the first logical state when the first amplifier branch maintains the first output node charged; and
the second logical output is generated in the second logical state when the second amplifier branch maintains the second output node charged.

9. The SSE of claim 1 wherein the first amplifier branch comprises a first pair of push-pull transistors, wherein each of the first pair of push-pull transistors has a gate that is cross connected to the second output node of the second amplifier branch to receive the second logical output as feedback.

10. The SSE of claim 9 wherein the second amplifier branch comprises a second pair of push-pull transistors, wherein each of the second pair of push-pull transistors has a gate that is cross connected to the first output node of the first amplifier branch to receive the first logical output as feedback.

11. The SSE of claim 9 wherein the first amplifier branch further comprises a first transistor stacked between the first pair of push-pull transistors such that the first transistor is connected to the first output node.

12. The SSE of claim 11 wherein the first transistor has a gate that is configured to receive a data input.

13. The SSE of claim 11 wherein the second amplifier branch comprises a second pair of push-pull transistors and a second transistor, wherein each of the second pair of push-pull transistors has a gate that is cross connected to the second output node of the second amplifier branch to receive the second logical output as feedback and the second transistor is stacked between the second pair of push-pull transistors such that the second transistor is connected to the second output node.

14. The SSE of claim 13 wherein:
the first transistor has a first gate that is configured to receive a data input; and
the second transistor has a second gate that is configured to receive an inverted data input.

15. The SSE of claim 1 wherein the first switchable discharge path comprises a first transistor having a first gate and a first inverter gate having a first input terminal and a first output terminal wherein:
the first input terminal is connected to receive the first logical output;
the first output terminal is connected to the first gate of the first transistor; and
the first transistor is connected to the first output node.

16. The SSE of claim 15 wherein the second switchable discharge path comprises a second transistor having a second gate and a second inverter gate having a second input terminal and a second output terminal wherein:
the second input terminal is connected to receive the second logical output;
the second output terminal is connected to the second gate of the second transistor; and
the second transistor is connected to the second output node.

17. The SSE of claim 16 wherein:
the first amplifier branch comprises a first pair of push-pull transistors, wherein each of the first pair of push-pull transistors has a gate that is cross connected to the second output node of the second amplifier branch to receive the second logical output as feedback; and
the second amplifier branch comprises a second pair of push-pull transistors, wherein each of the second pair of push-pull transistors has a gate that is cross connected to the second output node of the second amplifier branch to receive the second logical output as feedback.

18. The SSE of claim 17 wherein the first amplifier branch further comprises a third transistor stacked between the first pair of push-pull transistors such that the third transistor is connected to the first output node wherein the third transistor has a third gate that is configured to receive a data input.

19. The SSE of claim 18 wherein the second amplifier branch further comprises a fourth transistor stacked between the second pair of push-pull transistors such that the fourth transistor is connected to the second output node wherein the fourth transistor has a fourth gate that is configured to receive an inverted data input.

* * * * *